(12) United States Patent
Chou et al.

(10) Patent No.: US 11,496,048 B2
(45) Date of Patent: Nov. 8, 2022

(54) POWER SUPPLY WITH DUTY CYCLE LIMITING CIRCUIT, DUTY CYCLE LIMITING CIRCUIT, AND METHOD OF OPERATING THE SAME

(71) Applicant: DELTA ELECTRONICS, INC., Taoyuan (TW)

(72) Inventors: Ming-Wei Chou, Taoyuan (TW); Sheng-Jian Chen, Taoyuan (TW); Chia-Chang Hsu, Taoyuan (TW); Cheng-Yi Lo, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 142 days.

(21) Appl. No.: 17/029,927

(22) Filed: Sep. 23, 2020

(65) Prior Publication Data

US 2021/0184569 A1 Jun. 17, 2021

(30) Foreign Application Priority Data

Dec. 11, 2019 (CN) .......................... 201911266371.3

(51) Int. Cl.
*H02M 3/156* (2006.01)
*H03K 7/08* (2006.01)
*H02M 3/07* (2006.01)
*H03K 5/00* (2006.01)

(52) U.S. Cl.
CPC ............. *H02M 3/156* (2013.01); *H02M 3/07* (2013.01); *H03K 7/08* (2013.01); *H03K 2005/00045* (2013.01)

(58) Field of Classification Search
None
See application file for complete search history.

(56) References Cited

U.S. PATENT DOCUMENTS

| | | | |
|---|---|---|---|
| 7,705,673 B2* | 4/2010 | Teng | H03F 1/523 330/207 P |
| 9,425,699 B2* | 8/2016 | Han | H02M 3/33561 |
| 9,461,548 B2* | 10/2016 | Lee | H02M 3/33507 |
| 10,063,224 B2* | 8/2018 | Sato | H02M 3/158 |
| 10,707,867 B2* | 7/2020 | Banerjee | H03K 17/6871 |
| 2011/0057637 A1 | 3/2011 | Liu | |
| 2011/0102951 A1 | 5/2011 | Wu et al. | |
| 2011/0298384 A1* | 12/2011 | Tanigawa | G09G 3/3406 315/209 R |
| 2020/0379492 A1* | 12/2020 | Sakaguchi | G05F 1/575 |
| 2021/0126521 A1* | 4/2021 | Biellmann | H03K 17/08122 |

FOREIGN PATENT DOCUMENTS

| | | |
|---|---|---|
| JP | H1169788 A | 3/1999 |
| TW | 201110518 A | 3/2011 |
| TW | 201125250 A | 7/2011 |

* cited by examiner

*Primary Examiner* — Jeffrey A Gblende
(74) *Attorney, Agent, or Firm* — Muncy, Geissler, Olds & Lowe, P.C.

(57) ABSTRACT

A power supply with duty cycle limiting circuit includes a conversion circuit, a drive circuit, a control unit, and a duty cycle limiting circuit. The duty cycle limiting circuit converts a control signal into a control voltage, and determines whether a power switch of a power supply is turned off according to the control voltage and a threshold voltage to limit a duty cycle of the power switch.

17 Claims, 5 Drawing Sheets

POWER SUPPLY WITH DUTY CYCLE LIMITING CIRCUIT, DUTY CYCLE LIMITING CIRCUIT, AND METHOD OF OPERATING THE SAME

BACKGROUND

Technical Field

The present disclosure relates to a power supply with duty cycle limiting circuit, a duty cycle limiting circuit, and a method of operating the same, and more particularly to a power supply with duty cycle limiting circuit, a duty cycle limiting circuit, and a method of operating the same that a turned-on time in one switching cycle of a power switch of the power supply is limited.

Description of Related Art

The statements in this section merely provide background information related to the present disclosure and do not necessarily constitute prior art.

In the technical field of a power supply, a switching conversion circuit (for example but not limited to conversion circuits such as buck, boost, flyback, etc.) is usually used as the main power conversion circuit of the power supply. The characteristic of the switching conversion circuit is that the power switch of the main circuit in the conversion circuit must be switched on/off by the control unit to enable the switching conversion circuit to convert the input power to the output power. Therefore, if the power switch is damaged, the power supply cannot normally supply the output power to the load.

Due to the above reasons, the protection of power switches is particularly important when an abnormality occurs in the power supply. Specifically, when an abnormality occurs in the power supply, the control unit may provide a control signal with the incorrect duty cycle due to misjudgment (such as, but not limited to the current detection component is damaged, the wrong voltage was detected due to short circuit or a broken measurement instrument, abnormal input power or output power, etc.). When the duty cycle is too large, it will cause the power switch to be turned on for too long, which will easily cause the power switch to overheat and be damaged, thereby causing the risk of the power supply to burn.

Therefore, how to design a power supply with duty cycle limiting circuit, a duty cycle limiting circuit, and a method of operating the same that uses the duty cycle limiting circuit to limit the duty cycle of the power switch to avoid that the power switch on-time is too long and the condition of overheating damage is an important subject for the inventor.

SUMMARY

In order to solve the above-mentioned problems, the present disclosure provides a power supply with duty cycle limiting circuit. The power supply with duty cycle limiting circuit includes a conversion circuit, a drive circuit, a control unit, and a duty cycle limiting circuit. The conversion circuit includes a power switch, the power switch is switched to convert an input power into an output power. The drive circuit drives the power switch. The control unit is coupled to the drive circuit and provides a control signal to the drive circuit. The duty cycle limiting circuit is coupled to the drive circuit and the control unit. The duty cycle limiting circuit converts the control signal into a control voltage, and determines whether the power switch is turned off according to the control voltage and a threshold voltage so as to limit a duty cycle of the power switch.

In order to solve the above-mentioned problems, the present disclosure provides a duty cycle limiting circuit. The duty cycle limiting circuit is coupled to a control unit and a drive circuit of a power supply, the drive circuit drives a power switch according to a control signal provided by the control unit. The duty cycle limiting circuit includes a charge-discharge circuit, a comparison unit, and a switch unit. The charge-discharge circuit receives the control signal. The comparison unit is coupled to the charge-discharge circuit. The switch unit is coupled to the comparison unit and the drive circuit. The charge-discharge circuit performs charging and discharging according to the control signal to generate a control voltage, and the comparison unit determines whether the switch unit is turned on according to the control voltage and a threshold voltage so as to limit a duty cycle of the power switch through the switch unit.

In order to solve the above-mentioned problems, the present disclosure provides a method of operating a duty cycle limiting circuit. The method includes the steps of: (a) converting a control signal of a control unit of a power supply into a control voltage, (b) determining whether a power switch of the power supply is turned off according to the control voltage and a threshold voltage, and (c) controlling a drive circuit of the power supply to turn off the power switch to limit a duty cycle of the power switch when the control voltage is greater than the threshold voltage.

It is to be understood that both the foregoing general description and the following detailed description are exemplary, and are intended to provide further explanation of the present disclosure as claimed. Other advantages and features of the present disclosure will be apparent from the following description, drawings and claims.

BRIEF DESCRIPTION OF DRAWINGS

The present disclosure can be more fully understood by reading the following detailed description of the embodiment, with reference made to the accompanying drawing as follows.

DETAILED DESCRIPTION

Figure 1:
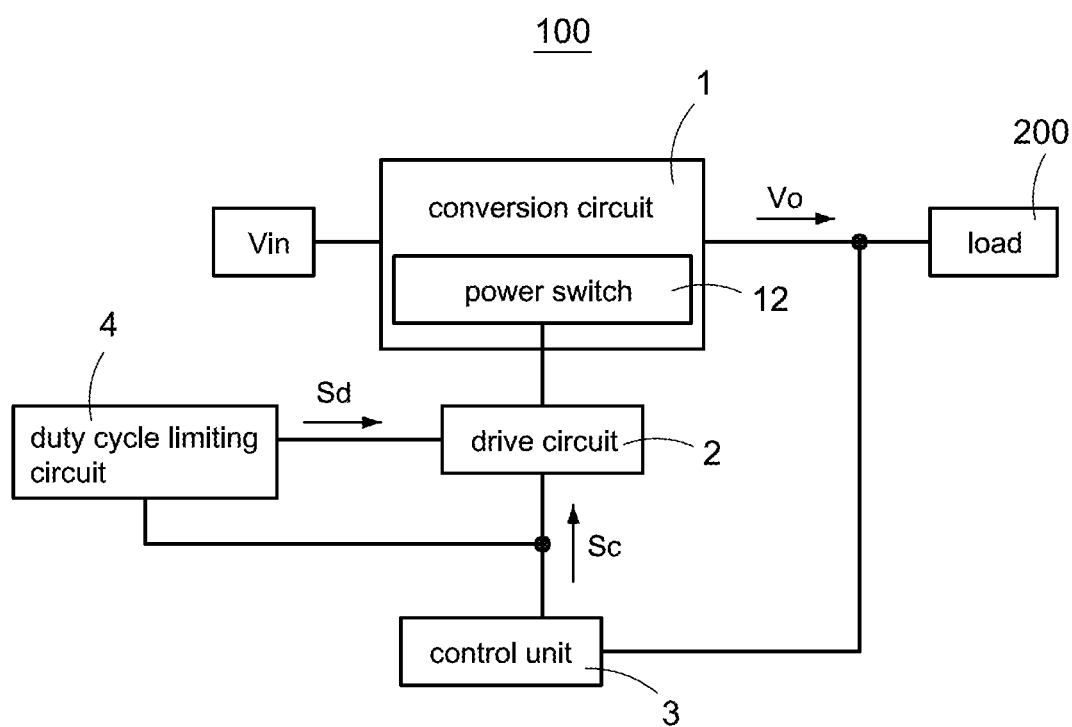
FIG. 1 is a block diagram of a power supply with duty cycle limiting circuit according to the present disclosure.

Reference will now be made to the drawing figures to describe the present disclosure in detail. It will be understood that the drawing figures and exemplified embodiments of present disclosure are not limited to the details thereof.

Please refer to FIG. 1, which shows a block diagram of a power supply with duty cycle limiting circuit according to the present disclosure. The power supply 100 includes a conversion circuit 1, a drive circuit 2, a control unit 3, and a duty cycle limiting circuit 4. The conversion circuit 1 includes a power switch 12, and an input power Vin is converted into an output power Vo by switching the power switch 12. The power supply 100 supplies the output power Vo to a load 200 to supply the required power for the operation of the load 200. The control unit 3 is coupled to the conversion circuit 1 and the drive circuit 2, and provides a control signal Sc to the drive circuit 2 according to the feedback of the output power Vo. Afterward, the drive circuit 2 controls the switching of the power switch 12 according to the control signal Sc. In particular, the control unit 3 controls the power supply 100 to stably provide the output power Vo by adjusting a duty cycle of the control signal Sc. The duty cycle limiting circuit 4 is coupled to the drive circuit 2 and the control unit 3, and provides a disable signal Sd to limit the turned-on time in one switching cycle of the power switch 12, wherein the maximum turned-on time is the maximum duty cycle of the power switch 12.

Specifically, the main object of the present disclosure is that when an abnormality occurs in the power supply 100, the control unit 3 incorrectly provides a control signal Sc with an excessively large duty cycle (i.e., a turned-on time in one switching cycle is too long) to the power switch 12 and causes the power switch 12 to overheat and be damaged due to an excessively long turned-on time. Therefore, the present disclosure uses the duty cycle limiting circuit 4 to limit the maximum turned-on time of the power switch 12 (that is, the maximum duty cycle) to avoid the condition that the power switch 12 is overheated and damaged due to the long turned-on time. Furthermore, the duty cycle limiting circuit 4 receives the control signal Sc and charges and discharges an energy storage component C to generate a control voltage Vc. Afterward, the duty cycle limiting circuit 4 determines whether the drive circuit 2 is controlled to turn off the power switch 12 by the disable signal Sd according to the control voltage Vc and a threshold voltage Vr. The threshold voltage Vr is the voltage corresponding to the maximum allowable duty cycle of the power switch 12. When the control voltage Vc is greater than the threshold voltage Vr, it means that the duty cycle of the control signal Sc is greater than the maximum allowable duty cycle of the power switch 12. When the duty cycle limiting circuit 4 determines that the control voltage Vc is greater than the threshold voltage Vr, the duty cycle limiting circuit 4 controls the drive circuit 2 to turn off the power switch 12 through the disable signal Sd. For detailed circuit operation, please refer to the following paragraphs. Since the present disclosure focuses on the manner of limiting duty cycle of the power switch 12 inside the conversion circuit 1 of the power supply 100, the embodiments of FIG. 2A and FIG. 2B only present the circuits related to power switch control (including the power switch 12, the drive circuit 2, the control unit 3, and the duty cycle limiting circuit 4), the other parts of the conversion circuit 1 are omitted.

Figure 2A:
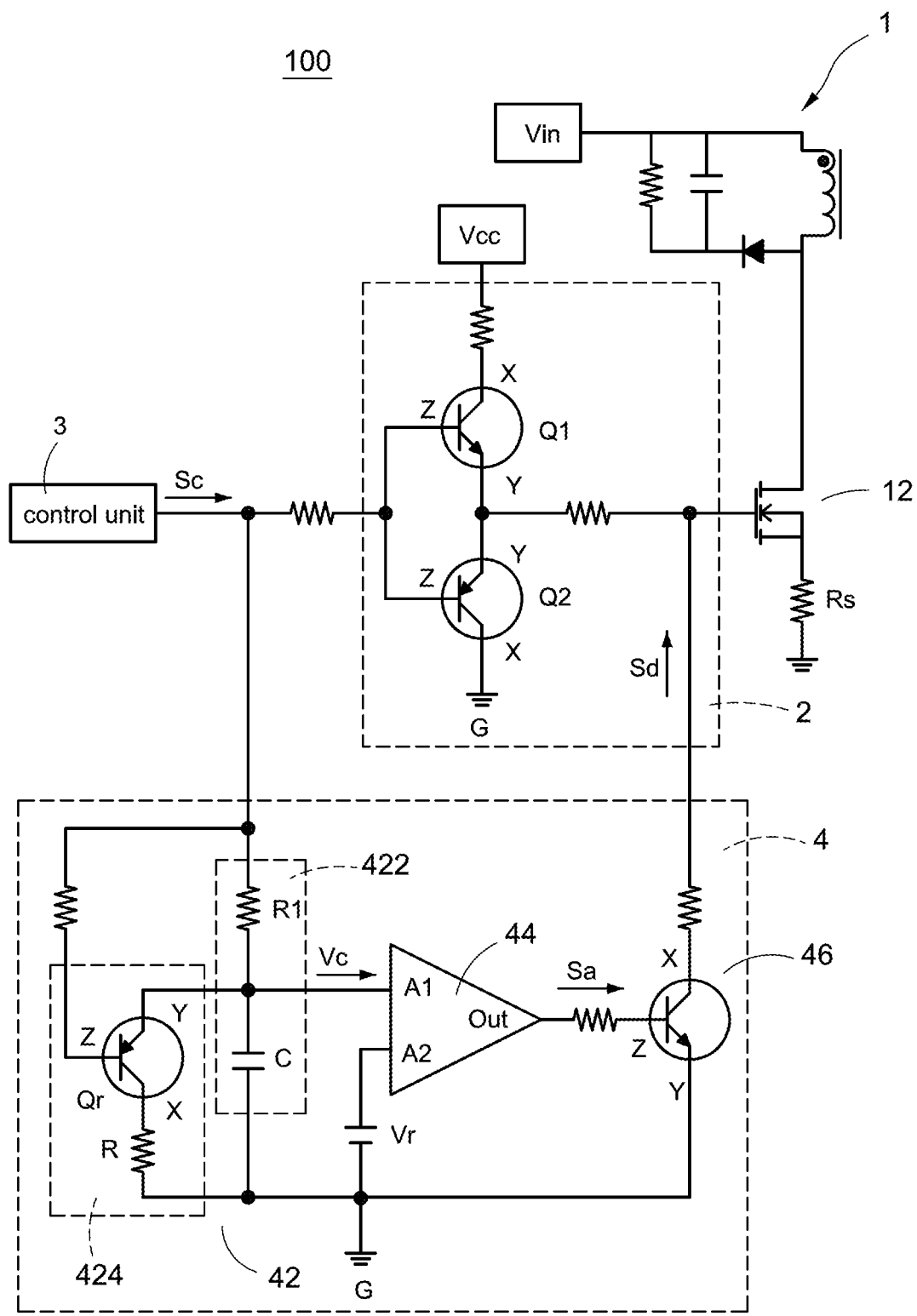
FIG. 2A is a circuit diagram of the duty cycle limiting circuit and a first coupling manner thereof according to the present disclosure.

Please refer to FIG. 2A, which shows a circuit diagram of the duty cycle limiting circuit and a first coupling manner thereof according to the present disclosure, and also refer to FIG. 1. For convenience, this embodiment takes the power supply 100 with an isolated transformer as an example, but is not limited thereto. In other words, the conversion circuit 1 inside the power supply 100 may be other types of converter topologies. A primary side of a transformer of the power supply 100 is coupled to the power switch 12 and a current detection resistor Rs, and receives the input power Vin. The drive circuit 2 is coupled between the control unit 3 and the power switch 12, and the duty cycle limiting circuit 4 is coupled to the drive circuit 2 and the control unit 3. The drive circuit 2 includes a first switch Q1 and a second switch Q2. A first end X of the first switch Q1 is coupled to a work voltage Vcc, and a second end Y of the first switch Q1 is coupled to a second end Y of the second switch Q2 and a control end of the power switch 12. A first end X of the second switch Q2 is coupled to a ground point G, and a control end Z of the first switch Q1 and a control end Z of the second switch Q2 are coupled to the control unit 3 to receive the control signal Sc. Specifically, a first level of the control signal Sc turns on the first switch Q1 and turns off the second switch Q2 so that the work voltage Vcc turns on the power switch 12 through the first switch Q1. On the contrary, a second level of the control signal Sc turns off the first switch Q1 and turns on the second switch Q2 so that the power switch 12 is turned off as the control end of the power switch 12 is coupled to the ground point G. In particular, the work voltage Vcc can be provided by the control unit 3 or external power sources.

The duty cycle limiting circuit 4 includes a charge-discharge circuit 42, a comparison unit 44, and a switch unit 46. The comparison unit 44 is coupled to the charge-discharge circuit 42 and the switch unit 46. The charge-discharge circuit 42 is coupled to the control unit 3 and the switch unit 46 is coupled to the second end Y of the first switch Q1 and the second end Y of the second switch Q2, that is, the switch unit 46 is coupled to the control end of the power switch 12. The charge-discharge circuit 42 includes a charge circuit 422 and a discharge circuit 424. The charge circuit 422 is coupled to the control unit 3 and the comparison unit 44, and the discharge circuit 424 is coupled to the charge circuit 422. Specifically, the charge circuit 422 includes a resistor R1 and an energy storage component C, and the discharge circuit 424 includes an energy release switch Qr and a resistance component R. One end of the resistor R1 is coupled to the control unit 3 and receives the control signal Sc, and the other end of the resistor R1 is coupled to one end of the energy storage component C. The energy release switch Qr includes a first end X, a second end Y, and a control end Z. The second end Y of the energy release switch Qr is coupled to the other end of the resistor R1 and one end of the energy storage component C, and the control end Z of the energy release switch Qr is coupled to the one end of the resistor R1 and the control unit 3. The first end X of the energy release switch Qr is coupled to one end of the resistance component R, and the other end of the resistance component R is coupled to the other end of the energy storage component C and the ground point G. The energy storage component C is, for example but not limited to, a component that can store energy such as a capacitor. If the cost and design complexity are taken into consideration, the capacitor is the preferred energy storage component C. The resistance component R may be, for example but not limited to, a component having energy consumption such as a resistor. If cost and design complexity are taken into consideration, a resistor is the preferred resistance component R.

When the control signal Sc is a first level (such as a high level in this embodiment), the control signal Sc with the first level charges the energy storage component C to generate a control voltage Vc. The resistor R1 limits the current to charge energy storage component C.

Taking the energy storage component C as a capacitor, the control signal Sc with the first level will charge the energy storage component C to generate the capacitor charging waveform of the control voltage Vc. At this condition, since the second end Y of the energy release switch Qr receives the control voltage Vc and the control end Z receives the control signal Sc with the first level, the energy release switch Qr is turned off so that the energy of the energy storage component C has no discharge path. Therefore, when the control signal Sc is at the first level for a longer time, the higher the voltage peak value of the control voltage Vc on the energy storage component C is, and vice versa. Through the voltage peak value, the length of time that the control signal Sc is at the first level can be known. When the control signal Sc is a second level (such as a low level in this embodiment), the second end Y of the energy release switch Qr receives the control voltage Vc and the control end Z receives the control signal Sc with the second level so that the energy release switch Qr is turned on and the discharge circuit 424 forms a discharge path. At this condition, the energy stored in the energy storage component C is discharged through the path composed of the energy release switch Qr and the resistance component R so that the control voltage Vc drops. Therefore, in each cycle of the control signal Sc, the charge-discharge circuit 42 performs charging and discharging, and generates the control voltage Vc corresponding to the control signal Sc. In one embodiment, the discharge circuit 424 can also be included in the control unit 3 to provide the discharge path.

The comparison unit 44 includes a first input end A1, a second input end A2, and an output end Out. The first input end A1 is coupled to the resistor R1 and the energy storage component C for receiving the control voltage Vc. The second input end A2 receives a threshold voltage Vr, and the output end Out provides a comparison signal Sa to a control end Z of the switch unit 46. A first end X of the switch unit 46 is coupled to the second end Y of the first switch Q1 and the second end Y of the second switch Q2, and a second end Y of the switch unit 46 is coupled to the ground point G. When the control voltage Vc is less than the threshold voltage Vr, the comparison signal Sa provided by the comparison unit 44 turns off the switch unit 46. When the control voltage Vc is greater than the threshold voltage Vr, the comparison signal Sa provided by the comparison unit 44 turns on the switch unit 46.

When the switch unit 46 is turned off, the path from the second end Y of the first switch Q1 and the second end Y of the second switch Q2 to the ground point G is open so that the control end of the power switch 12 is not coupled to the ground point G. Therefore, the work voltage Vcc when the control signal Sc is at the first level can be provided to the control end of the power switch 12 so that the power switch 12 is turned on. Accordingly, whether the power switch 12 is turned on or not is determined by the level of the control signal Sc. When the switch unit 46 is turned on, the second end Y of the first switch Q1 and the second end Y of the second switch Q2 are coupled to the ground point G. Even when the control signal Sc is at the first level, the power switch 12 is turned off because the control end of the power switch 12 is pulled low to close to the ground potential. Therefore, when the switch unit 46 is turned on, the power switch 12 cannot be controlled by the drive circuit 2 regardless of the level of the control signal Sc. Accordingly, the maximum duty cycle of the power switch 12 is limited by using the switch unit 46 to provide the path from the second end Y of the first switch Q1 and the second end Y of the second switch Q2 to the ground point G.

Figure 2B:
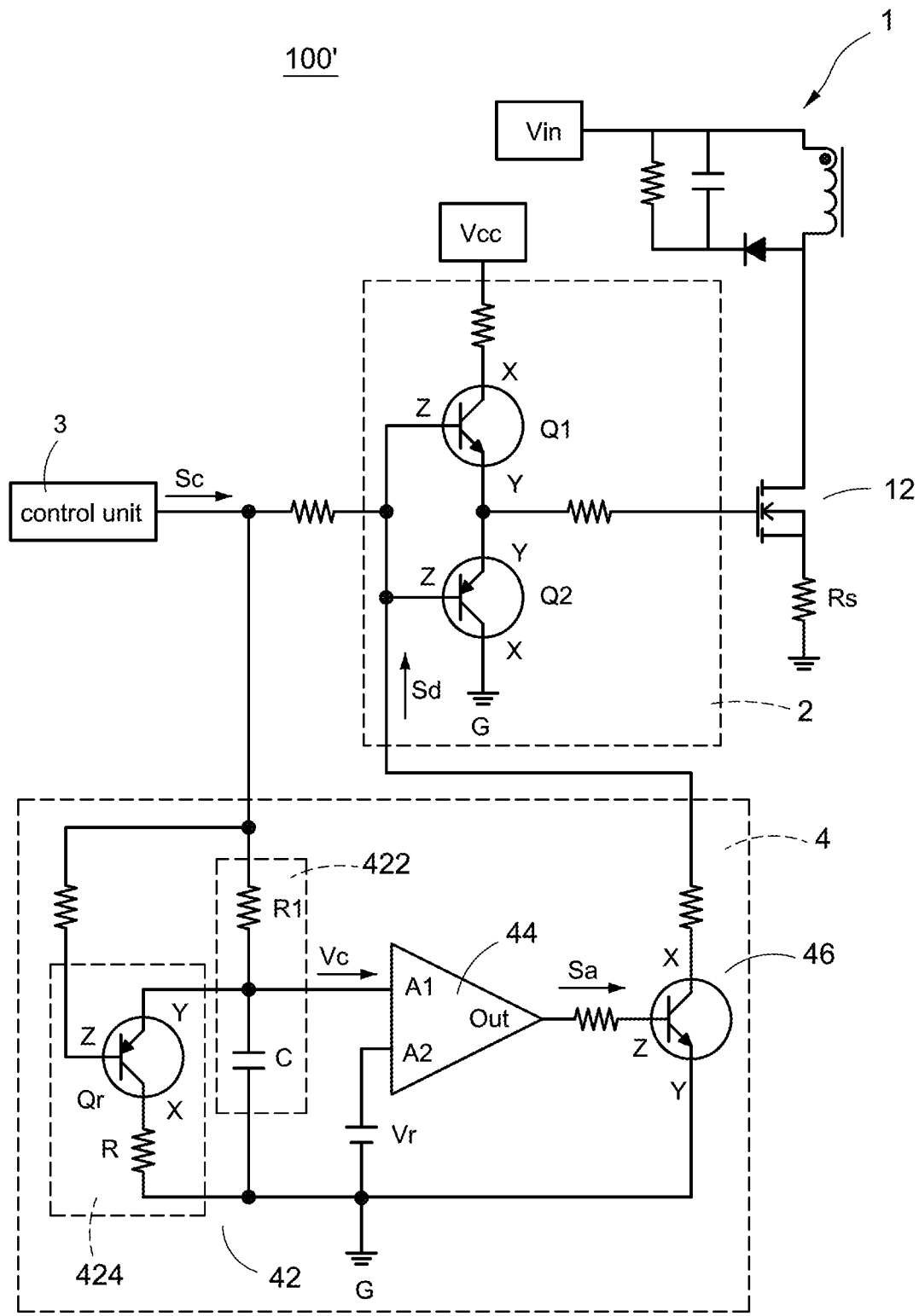
FIG. 2B is a circuit diagram of the duty cycle limiting circuit and a second coupling manner thereof according to the present disclosure.

Please refer to FIG. 2B, which shows a circuit diagram of the duty cycle limiting circuit and a second coupling manner thereof according to the present disclosure, and also refer to FIG. 1 to FIG. 2A. The major difference between the power supply 100' of this embodiment and the power supply 100 shown in FIG. 2A is that the first end X of the switch unit 46 is coupled to the control end Z of the first switch Q1 and the control end Z of the second switch Q2. When the switch unit 46 is turned off, the path between the control end Z of the first switch Q1, the control end Z of the second switch Q2 and the ground point G is open so that the control end Z of the first switch Q1 and the control end Z of the second switch Q2 are not coupled to the ground point G. At this condition, the control signal Sc with the first level can turn on the power switch 12 by turning on the first switch Q1. Therefore, whether the power switch 12 is turned on or not is determined by the level of the control signal Sc. When the switch unit 46 is turned on, the control end Z of the first switch Q1 and the control end Z of the second switch Q2 are coupled to the ground point G. Therefore, the control signal Sc with the first level is pulled low to the ground potential and the first switch Q1 cannot be turned on so that the power switch 12 is turned off. Accordingly, when the switch unit 46 is turned on, the power switch 12 cannot be controlled by the drive circuit 2 regardless of the level of the control signal Sc. Therefore, the maximum duty cycle of the control signal of the power switch 12 is limited by using the switch unit 46 to provide the path from the control end Z of the first switch Q1 and the control end Z of the second switch Q2 to the ground point G.

Since the first end X of the switch unit 46 is coupled to the control end Z of the first switch Q1 and the control end Z of the second switch Q2, the first switch Q1 and the second switch Q2 are not driven by the control signal Sc when the switch unit 46 is turned on. Therefore, compared with the coupling manner shown in FIG. 2A, the coupling manner in this embodiment can achieve the effect of reducing the power consumption of the power supply 100'.

Figure 3:
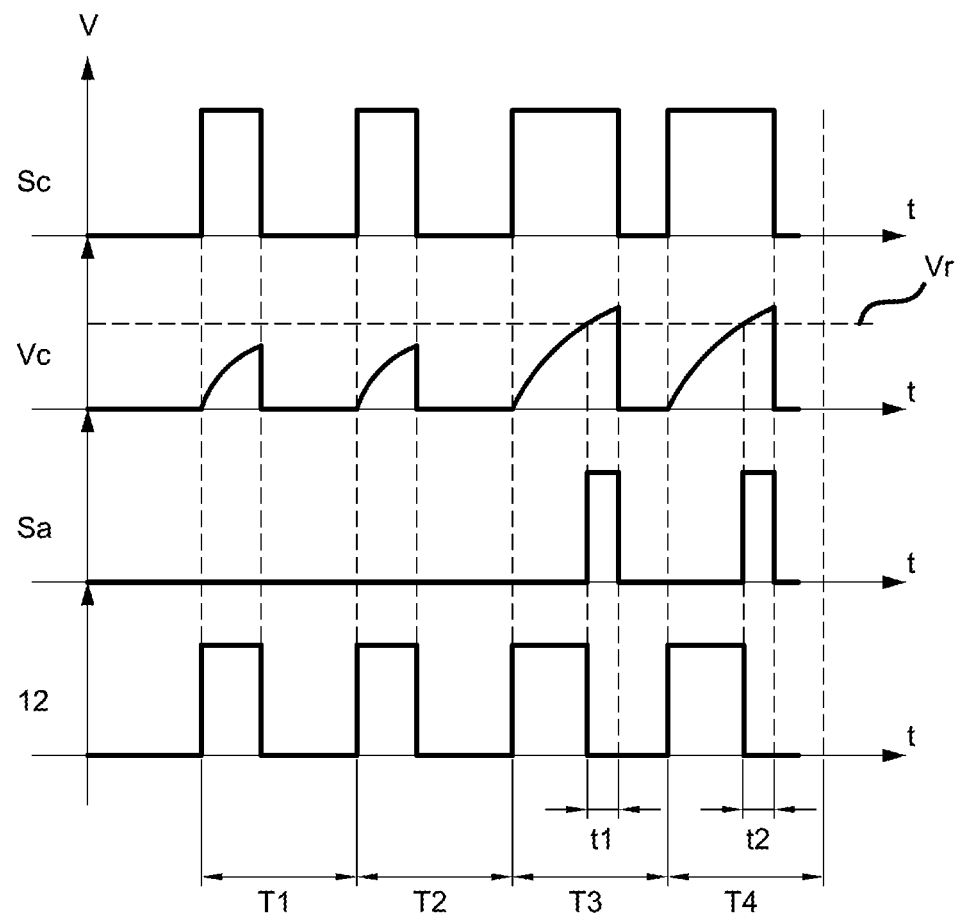
FIG. 3 is a signal waveform of the power supply with the duty cycle limiting circuit according to the present disclosure.

Please refer to FIG. 3, which shows a signal waveform of the power supply with the duty cycle limiting circuit according to the present disclosure, and also refer to FIG. 1 to FIG. 2B. The duty cycle of the control signal Sc is smaller during periods T1 to T2, and the duty cycle of the control signal Sc is larger during periods T3 to T4. When the control signal Sc is the first level (i.e., the high level), the energy storage component C (such as the capacitor) is charged to generate the control voltage Vc. When the control signal Sc is the second level (i.e., the low level), the energy release switch Qr is turned on to make the energy stored in the energy storage component C be released to ground, so that the control voltage Vc drops. Afterward, the comparison unit 44 compares the control voltage Vc with the threshold voltage Vr. Since the duty cycle of the control signal Sc during periods T3 to T4 is larger, the charge time of the energy storage component C is longer to make the voltage peak value be higher. During periods T3 to T4, the control voltage Vc in time periods t1 and t2 is greater than the threshold voltage Vr so that the comparison unit 44 provides a high-level comparison signal Sa in the periods t1 and t2 to turn on the switch unit 46, and therefore the disable signal Sd provided by the switch unit 46 disables the drive circuit 2. Therefore, the drive circuit 2 is disabled during the time periods t1 and t2 so that the power switch 12 is turned off during the time periods t1 and t2. Compare the control signal Sc (the first waveform in FIG. 3) with the signal of the control end of the power switch 12 (the fourth waveform in FIG. 3), it can be clearly seen that the duty cycle of the signal at the control end of the power switch 12 is limited so that the duty cycle limiting circuit 4 has the effect of limiting the maximum duty cycle of the power switch 12.

Figure 4:
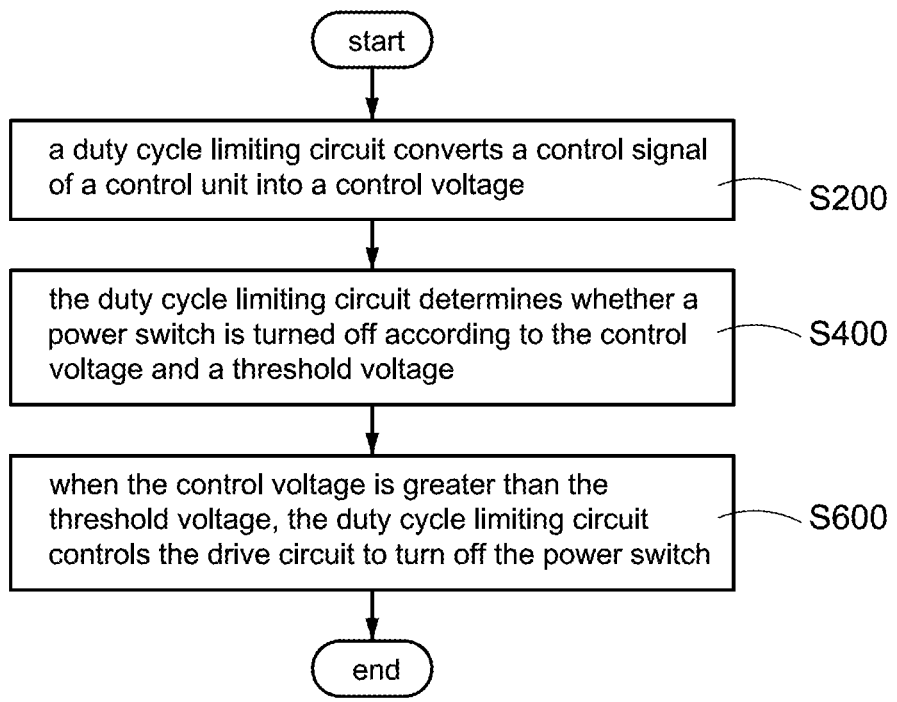
FIG. 4 is a flowchart of a method of operating the duty cycle limiting circuit according to the present disclosure.

Please refer to FIG. 4, which shows a flowchart of a method of operating the duty cycle limiting circuit according to the present disclosure, and also refer to FIG. 1 to FIG. 3. The method includes steps as follows. First, a duty cycle limiting circuit converts a control signal of the control unit into a control voltage (S200). When the control signal Sc is the first level, the control signal Sc with the first level charges the energy storage component C of the charge circuit 422 to generate the control voltage Vc. When the control signal Sc is the second level, the energy release switch Qr of the discharge circuit 424 is turned on so that the energy stored in the energy storage component C is quickly discharged through the path composed of the energy release switch Qr and the resistance component R, thereby causing the control voltage Vc to drop. Afterward, the duty cycle limiting circuit determines whether the power switch is turned off according to the control voltage and the threshold voltage (S400). The comparison unit 44 of the duty cycle limiting circuit 4 receives the control voltage Vc and the threshold voltage Vr, and provides the comparison signal Sa to the switch unit 46 according to the control voltage Vc and the threshold voltage Vr to further control the power switch 12. When the control voltage Vc is less than the threshold voltage Vr, the comparison signal Sa provided by the comparison unit 44 turns off the switch unit 46, and when the control voltage Vc is greater than the threshold voltage Vr, the comparison signal Sa provided by the comparison unit 44 turns on the switch unit 46.

Finally, when the control voltage is greater than the threshold voltage, the duty cycle limiting circuit controls the drive circuit to turn off the power switch (S600). When the switch unit 46 is turned off, the path between the second end Y of the first switch Q1, the second end Y of the second switch Q2 and the ground point G is open in FIG. 2A (or the path between the control end Z of the first switch Q1, the control end Z of the second switch Q2 and the ground point G is open in FIG. 2B). Accordingly, whether the power switch 12 is turned on or not is determined by the level of the control signal Sc (that is, the disable signal Sd provided by the switch unit 46 cannot disable the drive circuit 2 so that the drive circuit 2 drives the power switch 12 according to the control signal Sc). When the switch unit 46 is turned on, the path between the second end Y of the first switch Q1, the second end Y of the second switch Q2 and the ground point G is connected in FIG. 2A (or the path between the control end Z of the first switch Q1, the control end Z of the second switch Q2 and the ground point G is connected in FIG. 2B). Therefore, when the control signal Sc is at the first level, the control end of the power switch 12 is pulled low to fail to turn on the power switch 12 (i.e., the power switch 12 is turned off). That is, the disable signal Sd provided by the switch unit 46 prohibits the drive circuit 2 from turning on the power switch 12 to further limit the maximum duty cycle of the power switch 12.

In summary, the main advantages and effects of the present disclosure are that the duty cycle limiting circuit is coupled to the control unit and the drive circuit of the power supply to prevent the power switch of the power supply from overheating due to the control signal provided by the control unit with an excessive duty cycle.

Although the present disclosure has been described with reference to the preferred embodiment thereof, it will be understood that the present disclosure is not limited to the details thereof. Various substitutions and modifications have been suggested in the foregoing description, and others will occur to those of ordinary skill in the art. Therefore, all such substitutions and modifications are intended to be embraced within the scope of the present disclosure as defined in the appended claims.

What is claimed is:

1. A power supply with duty cycle limiting circuit, comprising:
    a conversion circuit comprising a power switch, the power switch being switched to convert an input power into an output power,
    a drive circuit configured to drive the power switch,
    a control unit coupled to the drive circuit and configured to provide a control signal to the drive circuit, and
    a duty cycle limiting circuit coupled to the drive circuit and the control unit, and the duty cycle limiting circuit comprises:
        a charge-discharge circuit configured to receive the control signal,
        a comparison unit coupled to the charge-discharge circuit, and
        a switch unit coupled to the comparison unit and the drive circuit,
    wherein the duty cycle limiting circuit is configured to convert the control signal into a control voltage, and determine whether the power switch is turned off according to the control voltage and a threshold voltage so as to limit a duty cycle of the power switch, and
    wherein the charge-discharge circuit is configured to perform charging and discharging according to the control signal to generate the control voltage, and the comparison unit is configured to determine whether the switch unit is turned on according to the control voltage and the threshold voltage so as to limit the duty cycle of the power switch through the switch unit.

2. The power supply with duty cycle limiting circuit in claim 1, wherein when the duty cycle limiting circuit is configured to determine that the control voltage is greater than the threshold voltage, the duty cycle limiting circuit is configured to control the drive circuit to turn off the power switch.

3. The power supply with duty cycle limiting circuit in claim 1, wherein when the control voltage is greater than the threshold voltage, the comparison unit is configured to control the drive circuit to turn off the power switch by turning on the switch unit.

4. The power supply with duty cycle limiting circuit in claim 1, wherein the charge-discharge circuit comprises:
    a charge circuit coupled to the control unit and the comparison unit, and
    a discharge circuit coupled to the charge circuit,
    wherein the control signal with a first level is configured to make the charge circuit generate the control voltage on an energy storage component of the charge circuit, and the control signal with a second level is configured to make the discharge circuit be turned on to cause the control voltage to drop.

5. The power supply with duty cycle limiting circuit in claim 4, wherein the discharge circuit comprises:
    an energy release switch coupled to the charge circuit, and
    a resistance component coupled to the energy release switch,
    wherein the control signal with the second level is configured to turn on the energy release switch so that the control voltage drops.

6. The power supply with duty cycle limiting circuit in claim 1, wherein the drive circuit comprises:
    a first switch coupled to a work voltage and the control unit, and
    a second switch coupled to the first switch, the control unit, and a ground point,
    wherein the control signal with a first level is configured to turn on the first switch and turn off the second switch so that the work voltage turns on the power switch; the control signal with a second level is configured to turn off the first switch and turn on the second switch so that a control end of the power switch is coupled to the ground point and the power switch is turned off.

7. The power supply with duty cycle limiting circuit in claim 6, wherein the duty cycle limiting circuit is coupled to a control end of the drive circuit, and the duty cycle limiting circuit is configured to determine whether the control end of the drive circuit is coupled to the ground point according to the control voltage.

8. The power supply with duty cycle limiting circuit in claim 6, wherein the duty cycle limiting circuit is coupled to the control end of the power switch, and the duty cycle limiting circuit is configured to determine whether the control end of the power switch is coupled to the ground point according to the control voltage.

9. A duty cycle limiting circuit coupled to a control unit and a drive circuit of a power supply, the drive circuit configured to drive a power switch according to a control signal provided by the control unit, the duty cycle limiting circuit comprising:
   a charge-discharge circuit configured to receive the control signal,
   a comparison unit coupled to the charge-discharge circuit, and
   a switch unit coupled to the comparison unit and the drive circuit,
   wherein the charge-discharge circuit is configured to perform charging and discharging according to the control signal to generate a control voltage, and the comparison unit is configured to determine whether the switch unit is turned on according to the control voltage and a threshold voltage so as to limit a duty cycle of the power switch through the switch unit.

10. The duty cycle limiting circuit in claim 9, wherein when the control voltage is greater than the threshold voltage, the comparison unit is configured to control the drive circuit to turn off the power switch by turning on the switch unit.

11. The duty cycle limiting circuit in claim 9, wherein the charge-discharge circuit comprises:
   a charge circuit coupled to the control unit and the comparison unit, and
   a discharge circuit coupled to the charge circuit,
   wherein the control signal with a first level is configured to make the charge circuit generate the control voltage on an energy storage component of the charge circuit, and the control signal with a second level is configured to make the discharge circuit be turned on to cause the control voltage to drop.

12. The duty cycle limiting circuit in claim 11, wherein the discharge circuit comprises:
   an energy release switch coupled to the charge circuit, and
   a resistance component coupled to the energy release switch,
   wherein the control signal with the second level is configured to turn on the energy release switch so that the control voltage drops.

13. The duty cycle limiting circuit in claim 9, wherein the switch unit is coupled to a control end of the drive circuit, and the switch unit is configured to determine whether the control end of the drive circuit is coupled to a ground point according to the control voltage.

14. The duty cycle limiting circuit in claim 9, wherein the switch unit is coupled to a control end of the power switch, and the switch unit is configured to determine whether the control end of the power switch is coupled to a ground point according to the control voltage.

15. A method of operating a duty cycle limiting circuit, comprising the steps of:
   (a) converting a control signal of a control unit of a power supply into a control voltage, said converting a control signal comprising:
      (a1) charging to generate the control voltage on an energy storage component according to the control signal with a first level, and discharging the energy storage component according to the control signal with a second level,
   (b) determining whether a power switch of the power supply is turned off according to the control voltage and a threshold voltage, and
   (c) controlling a drive circuit of the power supply to turn off the power switch to limit a duty cycle of the power switch when the control voltage is greater than the threshold voltage.

16. The duty cycle limiting circuit in claim 15, wherein the step (a1) further comprises a step of:
   determining whether a control end of the drive circuit is coupled to a ground point according to the control voltage to turn off the power switch.

17. The duty cycle limiting circuit in claim 15, wherein the step (a1) further comprises a step of:
   determining whether a control end of the power switch is coupled to a ground point so that the drive circuit turns off the power switch according to the control voltage.

* * * * *